(12) United States Patent
Tanaka (10) Patent No.: US 11,019,759 B2
(45) Date of Patent: May 25, 2021

(54) ELECTROMAGNETIC WAVE SHIELDING MATERIAL

(71) Applicant: JX Nippon Mining & Metals Corporation, Tokyo (JP)

(72) Inventor: Koichiro Tanaka, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 392 days.

(21) Appl. No.: 16/089,793

(22) PCT Filed: Dec. 1, 2016

(86) PCT No.: PCT/JP2016/085826
§ 371 (c)(1),
(2) Date: Sep. 28, 2018

(87) PCT Pub. No.: WO2017/168840
PCT Pub. Date: Oct. 5, 2017

(65) Prior Publication Data
US 2020/0315073 A1    Oct. 1, 2020

(30) Foreign Application Priority Data

Mar. 31, 2016 (JP) .............................. JP2016-073350

(51) Int. Cl.
| | |
|---|---|
| *B32B 3/00* | (2006.01) |
| *H05K 9/00* | (2006.01) |
| *B32B 7/025* | (2019.01) |
| *B32B 15/08* | (2006.01) |
| *B32B 15/085* | (2006.01) |
| *B32B 15/088* | (2006.01) |
| *B32B 15/095* | (2006.01) |
| *B32B 15/20* | (2006.01) |

(52) U.S. Cl.
CPC ........... *H05K 9/0088* (2013.01); *B32B 7/025* (2019.01); *B32B 15/08* (2013.01); *B32B 15/085* (2013.01); *B32B 15/088* (2013.01); *B32B 15/095* (2013.01); *B32B 15/20* (2013.01); *B32B 2250/40* (2013.01); *B32B 2250/42* (2013.01); *B32B 2307/202* (2013.01); *B32B 2307/212* (2013.01); *B32B 2307/732* (2013.01); *B32B 2457/00* (2013.01); *B32B 2605/08* (2013.01)

(58) Field of Classification Search
CPC ...... H05K 9/0088; B32B 7/025; B32B 15/08; B32B 15/085; B32B 15/088; B32B 15/095; B32B 15/20
See application file for complete search history.

(56) References Cited

U.S. PATENT DOCUMENTS

| | | | |
|---|---|---|---|
| 10,272,646 B2* | 4/2019 | Tanaka | ..................... C23C 22/52 |
| 10,442,159 B2* | 10/2019 | Tanaka | ................ H05K 9/0073 |
| 10,609,849 B2* | 3/2020 | Tanaka | ..................... B32B 7/12 |
| 2005/0208798 A1 | 9/2005 | Shimoda | |
| 2008/0012493 A1 | 1/2008 | Lee et al. | |
| 2015/0305144 A1 | 10/2015 | Tajima et al. | |

FOREIGN PATENT DOCUMENTS

| | | |
|---|---|---|
| JP | 58-18253 B2 | 2/1983 |
| JP | 7-290449 | 11/1995 |
| JP | 2003-060387 | 2/2003 |
| JP | 2003-285002 A | 10/2003 |
| JP | 2004-172909 | 6/2004 |

(Continued)

OTHER PUBLICATIONS

Kenichi Hatakeyama at. al., in "Hajimete Manabu Denjishahei Koza (Electromagnetic Shielding Course for Beginners)", Kagakujoho Shuppan Co., Ltd. (2013), p. 56, with English translation.
Extended European Search Report in EP Application No. 16897056.4 dated Jan. 22, 2019, 5 pages.
International Preliminary Report on Patentability and Written Opinion in International Application No. PCT/JP2016/085826 dated Oct. 11, 2018, 6 pages.
Search Report in International Application No. PCT/JP2016/085826 dated Feb. 21, 2017, 4 pages.

*Primary Examiner* — Elizabeth E Mulvaney
(74) *Attorney, Agent, or Firm* — Marshall, Gerstein & Borun LLP (57) ABSTRACT

Provided is an electromagnetic shielding material that has good magnetic field shielding properties against a low-frequency electromagnetic field of 1 MHz or less, lightweight and also excellent formability. The electromagnetic shielding material has a structure in which at least two metal foils are closely laminated via at least one resin layer, wherein at least one resin forming the at least one resin layer has no yield point at 150° C.; wherein all of combinations of the at least two metal foils and the at least one resin layer forming the electromagnetic shielding material satisfy the following equation (A):

$$\sigma_M \times d_M \times d_R \geq 3 \times 10^{-3}, \qquad \text{Equation (A):}$$

wherein the electromagnetic shielding material satisfies the following equation (B):

$$\frac{\sum_{a=1}^{i}(d_{Ra}+f_{Ra})}{\sum_{b=1}^{j}(d_{Mb}+f_{Mb})} \geq 0.8 \qquad \text{Equation (B)}$$

and wherein all the metal foils from the first foil to the $j^{th}$ foil satisfy the following equation (C):

$$\{(d_{Rb1} \times f_{Rb1})\,(d_{Rb2} \times f_{Rb2})\}/(d_{Mb} \times f_{Mb}) \geq 0.8. \qquad \text{Equation (C):}$$

6 Claims, 1 Drawing Sheet

(56) References Cited

FOREIGN PATENT DOCUMENTS

JP 2008-21979 A 1/2008
JP 4602680 B2 12/2010

* cited by examiner (a) Resin Having No Yield Point (b) Resin Having Yield Point

ELECTROMAGNETIC WAVE SHIELDING MATERIAL

TECHNICAL FIELD

The present invention relates to an electromagnetic shielding material. More particularly, the present invention relates to an electromagnetic shielding material that is applicable to covering materials or exterior materials for electric and electronic devices.

BACKGROUND ART

Recently, attention has been widely heightened on global environmental issues, and environmentally-friendly motor vehicles equipped with secondary batteries such as electric vehicles and hybrid vehicles have been progressively developed. The motor vehicles often employ a method of converting direct current generated from the mounted secondary battery into alternating current through an inverter, and then supplying required electric power to the alternating current motor to obtain driving force. Electromagnetic waves are generated due to switching operation of the inverter and the like. Since the electromagnetic waves disturb reception of on-board acoustic equipment or wireless equipment or the like, countermeasures have been taken to house the inverter or the battery, a motor or the like together with the inverter in a metallic case to shield the electromagnetic waves (Japanese Patent Application Publication No. 2003-285002 A). Metals with high magnetic permeability have been used as electromagnetic shielding materials to shield a low frequency electromagnetic field of 1 MHz or less, in particular a low frequency electromagnetic field of 500 kHz or less.

The electromagnetic waves are emitted not only from the motor vehicles but also from many electric and electronic devices including communication devices, displays and medical devices. The electromagnetic waves may cause erroneous operation of precision devices, and also may have a concern about an adverse effect on a human body. Therefore, various techniques have been developed for reducing the adverse effects of the electromagnetic waves using an electromagnetic shielding material. For example, a copper foil composite obtained by laminating a copper foil and a resin film has been used as the electromagnetic shielding material (Japanese Patent Application Publication No. H07-290449 A). The copper foil has electromagnetic shielding properties, and the resin film is laminated for reinforcement of the copper foil. An electromagnetic shielding structure is also known, in which metal layers are laminated on an inner side and an outer side of an intermediate layer made of an insulating material, respectively (Japanese Patent No. 4602680 B). An electromagnetic shielding optical member is also known, which comprises a base substrate and a laminated member formed on one surface of the base substrate and composed of a plurality of repetitive unit films comprising a metal layer and a high refractive index layer (niobium pentoxide) (Japanese Patent Application Publication No. 2008-21979 A).

CITATION LIST

Patent Literatures

Patent Document 1: Japanese Patent Application Publication No. 2003-285002 A
Patent Document 2: Japanese Patent Application Publication No. H07-290449 A
Patent Document 3: Japanese Patent No. 4602680 B
Patent Document 4: Japanese Patent Application Publication No. 2008-21979 A

SUMMARY OF THE INVENTION

Technical Problem

In the motor vehicles, weight reduction has been a major issue in terms of improvement of fuel economy. Therefore, to obtain sufficient shielding properties by a metal having high magnetic permeability, a thicker metal is required, which is not preferable in terms of the weight reduction. So, substitution of resin materials or carbon fiber materials for metal materials has also been investigated. However, the electromagnetic shielding effect cannot be expected for the resin materials and carbon fiber materials, although they can be three-dimensionally molded. On the other hand, an excessively decreased thickness of the metallic electromagnetic shielding material cannot improve the shielding effect and will tend to lead to breakage, resulting in a difficult molding process because a thinner metal layer does not have ductility. The techniques described in Japanese Patent Application Publication No. H07-290449 A and Japanese Patent No. 4602680 B also require a significantly increased thickness of the electromagnetic shielding material for obtaining the improved shielding effect, so that sufficient weight reduction could not be achieved and excellent formability could not be obtained. The technique described in Japanese Patent Application Publication No. 2008-21979 A is to laminate the nanometric metal layers in order to ensure optical transmission, so that the electromagnetic shielding properties will be limited, and the excessively thin metal layers will lead to poor formability.

In this regard, the techniques described in Japanese Patent Application Publication No. H07-290449 A and Japanese Patent No. 4602680 B are aimed at the shielding effect by a composite of an insulating layer and a metal layer and can achieve a certain degree of weight reduction. However, these documents lack consideration for formability of the shielding material formed of the composite of the insulating layer and the metal layer. The shielding material may be used in the form of a sheet, but it is often required to be molded into a complex three-dimensional shape so as to adapt to an inner surface shape or outer surface shape of a housing. Therefore, it would be advantageous if an electromagnetic shielding material having excellent three-dimensional formability can be provided.

The present invention has been made in light of the above circumstances. One of objects of the present invention is to provide an electromagnetic shielding material that has good magnetic field shielding properties against a low-frequency electromagnetic field of 1 MHz or less, lightweight and also excellent formability.

Solution to Problem

When a tensile stress is applied to a single metal foil, the entire metal foil is not uniformly deformed but is locally deformed. The stress concentrates on the locally deformed portion and results in breakage, so that the ductility is not high. On the other hand, for the resin layer, it tends to be entirely deformed in a uniform manner, so that the resin layer has higher ductility than that of the metal foil. When the metal foil and the resin layer are laminated in close contact with each other, the resin layer supports the metal foil and the metal foil is also uniformly deformed. Accordingly, the ductility is improved and the breakage during the forming process is suppressed.

Further, processing of a thin resin layer is generally carried out in an elevated temperature environment of from 80 to 300° C. Therefore, ductility in a molding temperature range is important for the purpose of improving the formability. To improve the ductility by closely laminating the resin layer on the metal foil, it is effective to properly combine the resin layers and the metal foils in view of strength balance of the metal layers and the resin in this molding temperature range. Furthermore, there is also a resin that softens in the molding temperature range to generate a yield point, even if the resin does not have the yield point at normal temperature. The resin tends to be locally deformed at the yield point. Therefore, it would be advantageous to use a resin having no yield point in the molding temperature range.

In one aspect, the present invention relates to:

an electromagnetic shielding material comprising a structure in which at least two metal foils are closely laminated via at least one resin layer, wherein at least one resin forming the at least one resin layer has no yield point at 150° C.;

wherein all of combinations of the metal foils and the at least one resin layer forming the electromagnetic shielding material satisfy the following equation (A):

$$\sigma_M \times d_M \times d_R \geq 3 \times 10^{-3}, \qquad \text{Equation (A):}$$

in which:

$\sigma_M$ represents a conductivity of metal foil at 20° C. (S/m);
$d_M$ represents a thickness of metal foil (m); and
$d_R$ represents a thickness of resin layer (m);

wherein the electromagnetic shielding material satisfies the following equation (B):

$$\frac{\sum_{a=1}^{i}(d_{Ra}+f_{Ra})}{\sum_{b=1}^{j}(d_{Mb}+f_{Mb})} \geq 0.8 \qquad \text{Equation (B)}$$

in which:

i represents the number of the at least one resin layer forming the electromagnetic shielding material;
j represents the number of the metal foils forming the electromagnetic shielding material;
$d_{Ra}$ represents a thickness of the $a^{th}$ resin layer (μm);
$f_{Ra}$ represents a stress (MPa) of the $a^{th}$ resin layer at 150° C. and 4% tensile strain;
$d_{Mb}$ represents a thickness of the $b^{th}$ metal foil (μm); and
$f_{Mb}$ represents a stress (MPa) of the $b^{th}$ metal foil at 150° C. and 4% tensile strain; and wherein when the number of the metal foils forming the electromagnetic shielding material is defined as j, all the metal foils from the first foil to the $j^{th}$ foil satisfy the following equation (C):

$$\{(d_{Rb1} \times f_{Rb1})+(d_{Rb2} \times f_{Rb2})\}/(d_{Mb} \times f_{Mb}) \geq 0.8 \qquad \text{Equation (C):}$$

in which:

b represents an integer from 1 to j;
$d_{Rb1}$ represents a thickness (μm) of the resin layer adjacent to one surface of the $b^{th}$ metal foil;
$f_{Rb1}$ represents a stress (MPa) of the resin layer adjacent to one surface of the $b^{th}$ metal foil, at 150° C. and 4% tensile strain;

$d_{Rb2}$ represents a thickness (μm) of the resin layer adjacent to the other surface of the $b^{th}$ metal foil;
$f_{Rb2}$ represents a stress (MPa) of the resin layer adjacent to the other surface of the $b^{th}$ metal foil, at 150° C. and 4% tensile strain;
$d_{Mb}$ represents a thickness (μm) of the $b^{th}$ metal foil;
$f_{Mb}$ represents a stress (MPa) of the $b^{th}$ metal foil, at 150° C. and 4% tensile strain.

In one embodiment of the electromagnetic shielding material according to the present invention, each metal foil forming the electromagnetic shielding material has a conductivity of $1.0 \times 10^6$ S/m or more at 20° C.

In another embodiment of the electromagnetic shielding material according to the present invention, each metal foil forming the electromagnetic shielding material has a thickness of from 4 to 50 μm.

In yet another embodiment of the electromagnetic shielding material according to the present invention, each resin layer forming the electromagnetic shielding material has a relative dielectric constant of from 2.0 to 10.0 at 20° C.

In yet another embodiment of the electromagnetic shielding material according to the present invention, each resin layer forming the electromagnetic shielding material has a thickness of from 4 to 500 μm.

In yet another embodiment of the electromagnetic shielding material according to the present invention, the at least two metal foils and the at least one resin layer forming the electromagnetic shielding material are closely laminated by thermocompression bonding.

Advantageous Effects of Invention

According to the present invention, it is possible to provide an electromagnetic shielding material that has good magnetic field shielding properties against a low-frequency electromagnetic field of 1 MHz or less, lightweight and also excellent formability.

DESCRIPTION OF EMBODIMENTS (Metal Foil)

Materials of the metal foils for use in the electromagnetic shielding material according to the present invention are not particularly limited, but metal materials with high conductivity are preferred in terms of improving the shielding properties against an alternating magnetic field and an alternating electric field. Specifically, the metal foils may be preferably formed by a metal having a conductivity of $1.0 \times 10^6$ S/m (a value at 20° C.; the same will apply hereinafter) or more. The conductivity may be preferably $10.0 \times 10^6$ S/m or more, and still more preferably $30.0 \times 10^6$ S/m or more, and most preferably $50.0 \times 10^6$ S/m or more. Examples of the metal include iron having a conductivity of about $9.9 \times 10^6$ S/m, nickel having a conductivity of about $14.5 \times 10^6$ S/m, aluminum having a conductivity of about $39.6 \times 10^6$ S/m, copper having a conductivity of about $58.0 \times 10^6$ S/m, and silver having a conductivity of about $61.4 \times 10^6$ S/m. In view of both the conductivity and costs, aluminum or copper may be preferably used for practical use. All of the metal foils used in the shielding material according to the present invention may be formed from the same metal, or different metals may be used for each layer. Further, alloys of the metals as stated above may be used. Various surface treated layers may be formed on the surface of the metal foil for the purpose of adhesion promotion, environmental resistance, heat resistance and rust prevention.

The metal foils may be subjected to Au plating, Ag plating, Sn plating, Ni plating, Zn plating, Sn alloy plating (Sn—Ag, Sn—Ni, Sn—Cu, and the like), a chromate treatment or like, for example in order to improve environmental resistance and heat resistance that will be required when the metal surface is the outermost layer. These treatments may be combined. The Sn plating or the Sn alloy plating may be preferred in terms of costs.

Further, the metal foils may be subjected to a chromate treatment, a roughening treatment, Ni plating or the like in order to improve adhesion between the metal foil and the resin layer. These treatments may be combined. The roughening treatment may be preferred because the adhesion is easily obtained.

Further, it is possible to provide at least one metal layer having high relative magnetic permeability in order to improve the shielding effect against the direct current magnetic field. Examples of the metal layer having high relative magnetic permeability include Fe—Ni alloy plating, Ni plating, and the like.

When using the copper foils, copper having higher purity may be preferred because it will improve the shielding performance. The purity may be preferably 99.5% by mass or more, and more preferably 99.8% by mass or more. Examples of the copper foil that can be used include rolled copper foils, electrolytic copper foils, metallized copper foils and the like. Among them, the rolled copper foils may be preferred because they have good flexibility and formability. When alloy elements are added to the copper foil to form a copper alloy foil, the total content of these elements and inevitable impurities may be less than 0.5% by mass. In particular, the copper foil may preferably contain one or more selected from the group consisting of Sn, Mn, Cr, Zn, Zr, Mg, Ni, Si, and Ag in the total amount of from 200 to 2000 ppm by mass, in order to improve elongation as compared with a pure copper foil having the same thickness.

The thickness of the metal foil used for the shielding material according to the present invention may be preferably 4 μm or more per one sheet of foil. If the thickness is less than 4 μm, the ductility of the metal foil may be remarkably lowered, leading to insufficient formability of the shielding material. Also, if the thickness of the foil per one sheet of foil is less than 4 μm, the lamination of a large number of metal foils will be required for obtaining the excellent electromagnetic shielding effect, thereby causing a problem of an increase in manufacturing costs. From this viewpoint, the thickness of the metal foil per one sheet of foil may be preferably 10 μm or more, and more preferably 15 μm or more, and still more preferably 20 μm or more, and even more preferably 25 μm or more, and still more preferably 30 μm or more. On the other hand, if the thickness of the foil per one sheet of foil exceeds 100 μm, the formability will be deteriorated. Therefore, the thickness of the foil may be preferably 100 μm or less, and more preferably 50 μm or less, and more preferably 45 μm or less, and still more preferably 40 μm or less.

It is preferable that a plurality of metal foils forming the shielding material are laminated via at least one resin layer, in terms of improvement of electromagnetic shielding properties. However, two metal foil layers will lead to an increase in the total thickness of the metal foils required for obtaining the magnetic field shielding property of 25 dB or more in a low frequency range of a frequency of 1 MHz or less and also lead to an increase in the thickness of one sheet of metal foil, so that the formability will be adversely affected. Therefore, it is more preferable that three or more metal foils are laminated in terms of ensuring the excellent electromagnetic shielding properties while reducing the total thickness of the metal foils. The lamination of three or more metal foils significantly improves the shielding effect as compared with the lamination of single metal foil layer or two metal foil layers, even if the total thickness of these metal foils is the same. On the other hand, although the lamination of more metal foils tends to improve the electromagnetic shielding properties, the increased number of the laminated metal foils increases the number of lamination steps, which will lead to an increase in manufacturing costs and the shielding effect tends to saturate. Therefore, the number of the metal foils forming the shielding material may be preferably 5 or less, and more preferably 4 or less.

Therefore, in one embodiment of the shielding material according to the present invention, the total thickness of the metal foils may be from 15 to 150 μm, or 100 μm or less, or 80 μm or less, or 60 μm or less.

(Resin Layer)

Close lamination of a plurality of metal foils via at least one resin layer allows significant improvement of the electromagnetic shielding effect and also significant improvement of formability because breakage of the metal foils are suppressed. This can achieve both weight reduction of the electromagnetic shielding material and the electromagnetic shielding effect. Although even if the metal foils are directly stacked on each other, the shielding effect may be improved due to an increase in the total thickness of the metal foils, the significant improvement effect cannot be obtained. The reason would be that the presence of the resin layer between the metal foils increases the number of reflections of electromagnetic waves to attenuate the electromagnetic waves. Further, even if the metal foils are directly stacked on each other, the formability cannot be improved.

It is preferable that the resin for forming the resin layer has no yield point at 150° C., in terms of improvement of the formability of the electromagnetic shielding material. Some resins will soften by heating during a molding process to generate a yield point, even if the resins have no yield point at normal temperature. Therefore, it is important for the resin to have no yield point during the heating. The temperature of the molding process is generally from about 80 to 300° C., and more generally around 100 to 180° C., although the temperature varies depending on the type of the resin layer and the molded shape. Therefore, the present invention employs a temperature of 150° C. as a representative value.

Figure 1:
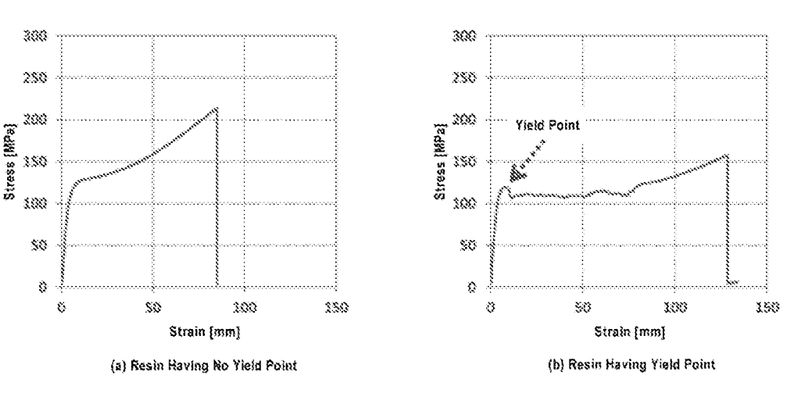
FIG. 1 shows graphs schematically showing a relationship between a stress and a strain for explaining a yield point of a resin.

As used herein, the phrase "resin has no yield point at 150° C." means that there is no position where a strain is increased with no increase in a stress when a tensile test is carried out on the same resin as that forming the resin layer by preparing a sample having a width of 12.7 mm and a length of 150 mm, performing the tensile test in the longitudinal direction of the sample at a tensile rate of 50 mm/min and at a temperature of 150° C. to a range up to a strain of 150 mm, in accordance with JIS K7127: 1999, and creating a stress-strain curve. FIG. 1 shows representative stress-strain curves for both (a) a resin having no yield point and (b) a resin having a yield point.

A resin layer having a large difference in impedance from the metal foil may be preferred in order to obtain the excellent electromagnetic shielding effect. To generate the large impedance difference, a smaller relative dielectric constant of the resin layer may be required. More specifically, the relative dielectric constant may be preferably 10 (a value at 20° C.; the same will apply hereinafter) or less, and more preferably 5.0 or less, and still more preferably 3.5 or less. In principle, the relative dielectric constant is never smaller than 1.0. In a generally available material, the relative dielectric constant is at least about 2.0. Even if the relative dielectric constant is lowered to be close to 1.0, the improvement of the shielding effect is limited, while a special and expensive material will have to be used. In view of the balance between the cost and the effect, the relative dielectric constant may be preferably 2.0 or more, and more preferably 2.2 or more.

A preferable material for forming the resin layer may be a synthetic resin in terms of processability. Further, the material for forming the resin layer that can be used includes a material in the form of a film. The resin layer may contain reinforcing fiber materials such as carbon fibers, glass fibers and aramid fibers. In terms of availability and processability, the synthetic resins include polyesters such as PET (polyethylene terephthalate), PEN (polyethylene naphthalate) and PBT (polybutylene terephthalate), olefin resins such as polyethylene and polypropylene, polyamides, polyimides, liquid crystal polymers, polyacetals, fluororesins, polyurethanes, acryl resins, epoxy resins, silicone resins, phenol resins, melamine resins, ABS resins, polyvinyl alcohol, urea resins, polyvinyl chloride, polycarbonates, polystyrenes, styrene butadiene rubbers and the like. Among them, PET, PEN, polyamides, and polyimides may be preferred in terms of processability and costs. The synthetic resins may be elastomers such as urethane rubbers, chloroprene rubbers, silicone rubbers, fluororubbers, styrene-based elastomers, olefinic elastomers, vinyl chloride-based elastomers, urethane-based elastomers, amide-based elastomers and the like. Among them, polyimide, polybutylene terephthalate, polyamide, and polyurethane can be suitably used since they are easy to adhere to metal foils by thermocompression bonding.

The thickness of each resin layer is not particularly limited, but since the thickness of one resin layer of less than 4 μm tends to decrease a (elongation) breaking strain of the shielding material, the thickness of one resin layer may be preferably 4 μm or more, and more preferably 7 μm or more, and more preferably 10 μm or more, and still more preferably 20 μm or more, and still more preferably 40 μm or more, and even more preferably 80 μm or more, and still more preferably 100 μm or more. On the other hand, the thickness of one resin layer of more than 600 μm also tends to decrease the (elongation) breaking strain of the shielding material. Therefore, the thickness of one resin layer may be preferably 600 μm or less, and more preferably 500 μm or less.

Examples of a method for closely laminating the resin layer and the metal foils include thermocompression bonding, ultrasonic bonding, bonding with an adhesive, and a method of forming a film by applying a resin in molten state onto the metal foil and curing the resin, and the like. Among them, the thermocompression bonding is preferable in terms of the stability of the adhesive strength in the forming temperature range. The thermocompression bonding is a method of heating both of the resin layer and the metal foil at a temperature of lower than melting points of both, and then applying a pressure to bring them into close contact with each other, and generating plastic deformation to bond them. It is also preferable to employ thermosonic bonding which allows thermocompression bonding while applying ultrasonic vibration. It is also possible to laminate the resin layer and the metal foil via an adhesive. However, when using the adhesive, it may soften by the heating during the forming process to decrease the adhesive strength between the metal foil and the resin layer. Therefore, the thermocompression bonding is preferred. For the thermocompression bonding, heating may be preferably carried out at a temperature lower by 30° C. than the melting point of the resin layer or at a higher temperature, and more preferably heated at a temperature lower by 20° C. than the melting point of the resin layer or at a higher temperature, and even more preferably heated at a temperature lower by 10° C. than the melting point of the resin layer or at a higher temperature, in terms of improving the adhesion between the resin layer and the metal foil. However, if excessive heat is applied, the resin layer will be melted and pushed out by pressure to impair uniformity of the thickness and physical properties. Therefore, the heating during the thermocompression bonding may be preferably carried out at a temperature higher by 20° C. than the melting point of the resin layer or at a lower temperature, and more preferably at a temperature higher by 10° C. than the melting point of the resin layer or at a lower temperature, and still more preferably at a temperature lower than or equal to the melting point of the resin layer. Further, a pressure during the thermocompression bonding may preferably be 0.05 MPa or more, and more preferably 0.1 MPa or more, and even more preferably 0.15 MPa or more, in terms of improving the adhesion between the resin layer and the metal foil. However, even if the pressure is excessively applied, the adhesion will not be improved. In addition, he resin layer is deformed to impair the uniformity of the thickness. Therefore, the pressure during the thermocompression bonding may preferably be 60 MPa or less, and more preferably 45 MPa or less, and still more preferably 30 MPa or less.

(Electromagnetic Shielding Material)

The electromagnetic shielding material (also simply referred to as "shielding material") may have a structure in which preferably two or more, and more preferably three or more metal foils are closely laminated via at least one resin layer. Examples of the laminated structure of the electromagnetic shielding material are as follows:

(1) metal foil/resin layer/metal foil;
(2) metal foil/resin layer/metal foil/resin layer;
(3) resin layer/metal foil/resin layer/metal foil/resin layer;
(4) metal foil/resin layer/metal foil/resin layer/metal foil/resin layer; and
(5) resin layer/metal foil/resin layer/metal foil/resin layer/metal foil/resin layer.

In the above (1) to (5), one "metal foil" can be formed by laminating a plurality of metal foils without interposing the resin layer, and one "resin layer" can also be formed by laminating a plurality of resin layers without interposing the metal foil. In other words, a plurality of metal foils laminated without interposing the resin layer are considered to be a single metal foil, and a plurality of resin layers laminated without interposing the metal foil are considered to be a single resin layer. Further, it is also possible to provide at least one layer other than the resin layer and the metal foil. However, in the present invention, the satisfying of the equation (C) is an important requirement as will be described below. Therefore, at least one surface of each of all the metal foils forming the shielding material should be adjacent to the resin layer.

However, both sides of each metal foil forming the electromagnetic shielding material may preferably be sandwiched by the resin layers, in terms of the formability. The sandwiching of the both sides of each metal foil by the resin layers can allow improvement of an effect of preventing breakage during the forming process. In other words, an embodiment where both outermost layers are formed of the resin layers and the resin layers and the metal foils are alternately laminated one by one is more preferable than embodiments where the metal foils form the outermost layers of the shielding material, and embodiments in which there are portions where a plurality of metal foils are laminated without interposing the resin layer(s) in the inner layers of the shielding material.

In terms of significantly improving the electromagnetic shielding effect, the metal foil and the resin layer are preferably selected such that all the combinations of the metal foils and the at least one resin layer forming the electromagnetic shielding material satisfy the following equation (A):

$$\sigma_M \times d_M \times d_R \geq 3 \times 10^{-3}, \quad \text{Equation (A):}$$

in which:
$\sigma_M$ represents a conductivity of metal foil at 20° C. (S/m);
$d_M$ represents a thickness of metal foil (m); and
$d_R$ represents a thickness of resin layer (m).

Symbols used in the following descriptions are defined as follows:
$Z_R$: impedance of resin layer $(\Omega) = Z_0 \times \sqrt{(1/\varepsilon_R)}$;
$\varepsilon_R$: relative dielectric constant of resin layer at 20° C.;
$\gamma_R$: propagation constant $= j \times 2\pi \sqrt{(\varepsilon_R/\lambda)}$; j is the imaginary unit;
$\lambda$: wavelength (m): 300 m at 1 MHz;
$Z_o$: impedance in vacuum = 377$\Omega$.

The shielding property can be represented by the following relationship using four-terminal matrix:

$$\begin{bmatrix} E_x^t \\ H_x^t \end{bmatrix} = \begin{bmatrix} a & b \\ c & d \end{bmatrix} \begin{bmatrix} E_x^i \\ H_x^i \end{bmatrix} \quad \text{(Eq. 1)}$$

in which $E_x^i$ and $H_x^i$ represents an electric field and a magnetic field of an incident wave, respectively; and $E_x^t$ and $H_x^t$ represent an electric field and a magnetic field of a transmitted wave.

In this case, the shielding effect (SE) can be expressed by the following equation using the Schelkunov method $$SE = 20 \log[(a + b/Z_0 + cZ_0 + d)/2] \quad \text{(Eq. 2)}$$

When using the metal foil as the component for the shielding material, a may be equal to 1, b may be equal to 0, c may be equal to $\sigma_M \times d_M$, and d may be equal to 1. Substituting these into the equation 1 yields the following equation:

$$\begin{bmatrix} E_x^t \\ H_x^t \end{bmatrix} = \begin{bmatrix} 1 & 0 \\ \sigma_M d_M & 1 \end{bmatrix} \begin{bmatrix} E_x^i \\ H_x^i \end{bmatrix} \quad \text{(Eq. 3)}$$

When using the resin layer as the component for the shielding material, a may be equal to 1, b may be equal to $Z_R \times \gamma_R \times d_R$, c may be equal to $\gamma_R \times d_R / Z_R$ and d may be equal to 1. Substituting these into the equation 1 yields the following equation:

$$\begin{bmatrix} E_x^t \\ H_x^t \end{bmatrix} = \begin{bmatrix} 1 & Z_R \gamma_R d_R \\ \gamma_R d_R / Z_R & 1 \end{bmatrix} \begin{bmatrix} E_x^i \\ H_x^i \end{bmatrix} \quad \text{(Eq. 4)}$$

Furthermore, the shielding property when the resin layer(s) and the metal foils are laminated can be theoretically obtained from the product of the four-terminal matrices corresponding to respective layers. For example, when the shielding material is formed by a laminated structure of metal (M1)/resin (R1)/metal (M2), incident and transmitted waves can be expressed by the following equation:

$$\begin{bmatrix} E_x^t \\ H_x^t \end{bmatrix} = \begin{bmatrix} 1 & 0 \\ \sigma_{M1} d_{M1} & 1 \end{bmatrix} \begin{bmatrix} 1 & Z_{R1} \gamma_{R1} d_{R1} \\ \gamma_{R1} d_{R1} / Z_{R1} & 1 \end{bmatrix} \begin{bmatrix} 1 & 0 \\ \sigma_{M2} d_{M2} & 1 \end{bmatrix} \begin{bmatrix} E_x^i \\ H_x^i \end{bmatrix} \quad \text{(Eq. 5)}$$

$$= \begin{bmatrix} 1 + Z_{R1} \gamma_{R1} d_{R1} \sigma_{M2} d_{M2} & Z_{R1} \gamma_{R1} d_{R1} \\ \sigma_{M1} d_{M1} + Z_{R1} \gamma_{R1} d_{R1} \sigma_{M1} d_{M1} \sigma_{M2} d_{M2} + \gamma_{R1} d_{R1} / Z_{R1} + \sigma_{M2} d_{M2} & 1 + Z_{R1} \gamma_{R1} d_{R1} \sigma_{M1} d_{M1} \end{bmatrix}$$

$$\begin{bmatrix} E_x^i \\ H_x^i \end{bmatrix}$$

Further, when the shielding material is formed by a laminated structure of metal (M1)/resin (R1)/metal (M2)/resin (R2)/metal (M3), the incident and transmitted waves can be expressed by the following equation:

$$\begin{bmatrix} E_x^t \\ H_x^t \end{bmatrix} = \begin{bmatrix} 1 & 0 \\ \sigma_{M1} d_{M1} & 1 \end{bmatrix} \begin{bmatrix} 1 & Z_{R1} \gamma_{R1} d_{R1} \\ \gamma_{R1} d_{R1} / Z_{R1} & 1 \end{bmatrix} \begin{bmatrix} 1 & 0 \\ \sigma_{M2} d_{M2} & 1 \end{bmatrix} \quad \text{(Eq. 6)}$$

$$\begin{bmatrix} 1 & Z_{R2} \gamma_{R2} d_{R2} \\ \gamma_{R2} d_{R2} / Z_{R2} & 1 \end{bmatrix} \begin{bmatrix} 1 & 0 \\ \sigma_{M3} d_{M3} & 1 \end{bmatrix} \begin{bmatrix} E_x^i \\ H_x^i \end{bmatrix}$$

When this is developed, the following equation is obtained:

$$\begin{bmatrix} E_x^t \\ H_x^t \end{bmatrix} = \begin{bmatrix} A & B \\ C & D \end{bmatrix} \begin{bmatrix} E_x^i \\ H_x^i \end{bmatrix} \quad \text{(Eq. 7)}$$

in which A, B, C and D are as follows:

$A = 1 \times Z_{R1} \gamma_{R1} d_{R1} \sigma_{M2} + Z_{R2} \gamma_{R2} d_{R2} \sigma_{M3} d_{M3} +$
$\quad Z_{R1} \gamma_{R1} d_{R1} \sigma_{M3} d_{M3} +$
$\quad Z_{R1} \gamma_{R2} \gamma_{R2} d_{R2} \Gamma_{M2} d_{M2} \sigma_{M3} d_{M3};$ $B = Z_{R2} \gamma_{R2} d_{R2} + Z_{R1} \gamma_{R1} d_{R1} Z_{R2} \gamma_{R2} d_{R2} \sigma_{M2} d_{M2} +$
$\quad Z_{R1} \gamma_{R1} d_{R1};$ $C = \sigma_{M1} d_{M1} + \sigma_{M2} d_{M2} + \sigma_{M3} d_{M3} + \gamma_{R1} d_{R1}/Z_{R1} + \gamma_{R2} d_{R2}/$
$\quad Z_{R2} + Z_{R1} \gamma_{R1} d_{R1} \sigma_{M1} d_{M1} +$
$\quad Z_{R1} \gamma_{R1} d_{R1} \sigma_{M1} d_{M1} \sigma_{M3} d_{M3} +$
$\quad Z_{R1} \gamma_{R1} d_{R1} Z_{R2} \gamma_{R2} d_{R2} \sigma_{M1} d_{M1} \sigma_{M2} d_{M2} \sigma_{M3} d_{M3} +$
$\quad Z_{R2} \gamma_{R2} d_{R2} \sigma_{M2} d_{M2} \sigma_{M3} d_{m3} +$
$\quad Z_{R2} \gamma_{R2} d_{R2} \sigma_{M3} d_{M3} \gamma_{R1} d_{R1}/Z_{R1};$ $D + Z_{R2} \gamma_{R2} d_{R2} \sigma_{M1} d_{M1} + Z_{R2} \gamma_{R2} d_{R2} \sigma_{M1} d_{M1} \sigma_{M2} d_{M2} +$
$\quad Z_{R2} \gamma_{R2} d_{R2} \sigma_{M2} d_{M2} + Z_{R1} \gamma_{R1} d_{R1} \sigma_{M1} d_{M1} +$
$\quad Z_{R2} \gamma_{R2} d_{R2} \gamma_{R1} d_{R1}/Z_{R1}.$ It is theoretically understood from the above examples that the shielding effect of the laminate of the metal foils and the resin layers can be improved by increasing the "$\sigma_M \times d_M \times Z_R \times \gamma_R \times d_R$" for all combinations of the metal foils and the resin layer(s) to be used. However, as described, for example by "Kenichi Hatakeyama at. al., in "Hajimete Manabu Denjishahei Koza (Electromagnetic Shielding Course for Beginners)", Kagakujoho Shuppan Co., Ltd. (2013), p. 56, it was conventionally believed that the "$Z_R \times$ $\gamma_R \times d_R$" was extremely small to be approximated to zero in the low frequency region. Therefore, according to this theory, the "$\sigma_M \times d_M \times Z_R \times \gamma_R \times d_R$" was also a parameter that was approximated to be zero. In contrast, the present inventor has found that the "$\sigma_M \times d_M \times Z_R \times \gamma_R \times d_R$" can become a large value to such an extent that it cannot be approximated to zero and it has a significant effect even in the low frequency region by combining suitable metal foils and suitable resin layer(s) to adjust the $d_R$, $\sigma_M$ and $d_M$.

The present inventor has repeated experiments of the shielding effects of the laminate formed of the metal foils and the resin layer(s), and found that the "$\sigma_M \times d_M \times d_R$" has a significant effect even in the low frequency region of about 1 MHz, and that the shielding effect can be effectively improved by selecting the metal foils and the resin layer(s) such that all of the combinations of the metal foils and the resin layer(s) forming the electromagnetic shielding material satisfy the equation: $\sigma_M \times d_M \times d_R \geq 3 \times 10^{-3}$. All of the combinations of the metal foils and the resin layer(s) forming the electromagnetic shielding material may preferably satisfy $\sigma_M \times d_M \times d_R \geq 1 \times 10^{-2}$, and more preferably $\sigma_M \times d_M \times d_R \geq 4 \times 10^{-2}$, and more preferably $\sigma_M \times d_M \times d_R \geq 8 \times 10^{-2}$, and even more preferably $\sigma_M \times d_M \times d_R \geq 1 \times 10^{-1}$.

Although no particular upper limit is set to the $\sigma_M \times d_M \times d_R$, all of the combinations of the metal foils and the resin layer(s) forming the electromagnetic shielding material may generally satisfy $\sigma_M \times d_M \times d_R \leq 10$, and typically $\sigma_M \times d_M \times d_R \leq 1$, in terms of the thickness or materials to be used.

Further, in terms of improving ability of the resin layer to support the metal foil and to improve the formability, it is important to balance the strengths of both the metal foil and the resin layer in the high temperature range where the forming process is performed. Experimentally, the ductility becomes satisfactory when a value obtained by dividing the strength of the entire resin layer(s) per unit width (($d_{R1} \times f_{R1}$)+($d_{R2} \times f_{R2}$)+ ... )) by the strength of the entire metal foils per unit width (($d_{M1} \times f_{M1}$)+($d_{M2} \times f_{M2}$) ... ) is 0.8 or more, at 150° C. Thus, the following equation (B) is preferably satisfied:

$$\frac{\sum_{a=1}^{i}(d_{Ra}+f_{Ra})}{\sum_{b=1}^{j}(d_{Mb}+f_{Mb})} = \frac{(d_{R1} \times f_{R1}) + (d_{R2} \times f_{R2}) + \ldots + (d_{Ri} \times f_{Ri})}{(d_{M1} \times f_{M1}) + (d_{M2} \times f_{M2}) + \ldots + (d_{Mj} \times f_{Mj})} \geq 0.8$$

Equation (B)

in which:
i represents the number of the at least one resin layer forming the electromagnetic shielding material; and
j represents the number of the metal foils forming the electromagnetic shielding material.

The $\Sigma(d_{Ra} \times f_{Ra})/\Sigma(d_{Mb} \times f_{Mb})$ is preferably 1.0 or more, and more preferably 1.5 or more, and still more preferably 2.0 or more. On the other hand, the $\Sigma(d_{Ra} \times f_{Ra})/\Sigma(d_{Mb} \times f_{Mb})$ is preferably 6.0 or less, and more preferably 5.0 or less, and still more preferably 4.5 or less, because when the resin layer is unnecessarily thicker or has high strength, the softness is decreased and the processability is deteriorated.

The equation (B) controls the relationship between the stress and the thickness of the whole of the metal foils and the resin layer(s). However, if any one of the metal foils is extremely thick and the adjacent resin layer is thin, the ductility of the metal foil is decreased. For this reason, only with the equation (B), it is difficult to sufficiently exert the ability of the resin layer to support the metal foil. Therefore, it is also important to control the relationship between each metal foil forming the shielding material and the adjacent resin layers on both sides of each metal foil. More particularly, when the number of the metal foils forming the electromagnetic shielding material is defined as j, all the metal foils from the first foil to the $j^{th}$ foil preferably satisfy the following formula (C):

$$\{(d_{Rb1} \times f_{Rb1})+(d_{Rb2} \times f_{Rb2})\}/(d_{Mb} \times f_{Mb}) \geq 0.8 \qquad \text{Equation (C):}$$

in which:
b represents an integer from 1 to j;
$d_{Rb1}$ represents a thickness (μm) of resin layer adjacent to one surface of the $b^{th}$ metal foil;
$f_{Rb1}$ represents a stress (MPa) of resin layer adjacent to one surface of the $b^{th}$ metal foil, at 150° C. and 4% tensile strain;
$d_{Rb2}$ represents a thickness (μm) of resin layer adjacent to the other surface of the $b^{th}$ metal foil
$f_{Rb2}$ represents a stress (MPa) of resin layer adjacent to the other surface of the $b^{th}$ metal foil, at 150° C. and 4% tensile strain;
$d_{Mb}$ represents a thickness (μm) of $b^{th}$ metal foil; $f_{Mb}$ represents a stress (MPa) of $b^{th}$ metal foil at 150° C. and 4% tensile strain.

Here, when one or both of the surfaces of the metal foil are not adjacent to the resin layer(s), such as when the outermost layer of the shielding material is the metal foil, the $(d_{Rb1} \times f_{Rb1})+(d_{Rb2} \times f_{Rb2})$ is calculated, assuming that a resin layer having a thickness of zero and a stress of zero at 150° C. and 4% tensile strain of 4% is adjacent to the metal foil.

The $\{(d_{Rb1} \times f_{Rb1})+(d_{Rb2} \times f_{Rb2})\}/(d_{Mb} \times f_{Mb})$ is preferably 1.0 or more, and more preferably 1.5 or more, and even more preferably 2.0 or more, for all the metal foils forming the shielding material. On the other hand, the $\{(d_{Rb1} \times f_{Rb1})+(d_{Rb2} \times f_{Rb2})\}/(d_{Mb} \times f_{Mb})$ is preferably 6.0 or less, and more preferably 5.0 or less, and still more preferably 4.5 or less, for all the metal foils forming the shielding material, because when the resin layer is unnecessarily thicker or has high strength, the softness is decreased and the processability is deteriorated.

In the equations (B) and (C), the stresses (MPa) of the resin layer and the metal foil at 150° C. and 4% tensile strain refers to stresses at 4% tensile strain when performing a tensile test by preparing a sample having a width of 12.7 mm and a length of 150 mm and carrying out the test in the longitudinal direction of the sample at a temperature of 150° C. and at a tensile rate of 50 mm/min, in accordance with JIS K7127: 1999.

In one embodiment of the electromagnetic shielding material according to the present invention, the total thickness of the electromagnetic shielding material may be from 50 to 1500 μm, may be 1000 μm or less, may be 600 μm or less, may be 400 μm or less, may be 300 μm or less, or may be 250 μm or less.

According to one embodiment of the electromagnetic shielding material according to the present invention, the electromagnetic shielding material may have a magnetic field shielding property (a degree of an attenuated signal on a receiving side) of 25 dB or more at 1 MHz, and preferably a magnetic field shielding property of 30 dB or more, and more preferably a magnetic field shielding property of 40 dB or more, and more preferably a magnetic field shielding property of 50 dB or more, and even more preferably a magnetic field shielding property of 60 dB or more, for example a magnetic field shielding property of 36 to 90 dB. In the present invention, the magnetic field shielding property is measured by a KEC method. The KEC method refers to "an electromagnetic shielding property measurement method" in KEC Electronic Industry Development Center.

The electromagnetic shielding material according to the present invention can be used for applications for shielding electromagnetic waves, in particular for electric and electronic devices (for example, inverters, communication devices, resonators, electron tubes, discharge lamps, electric heating devices, electric motors, generators, electronic components, printed circuits, medical devices and the like).

EXAMPLE

Examples of the present invention are described below together with Comparative Examples, which are provided for a better understanding of the present invention and its advantages, and are not intended to limit the invention.

Test Example 1

Applicability Evaluation of Film Insert Molding

The following materials were prepared as the metal foil and the resin film. All of them are commercially available products. For polyimide films, one having a yield point at 150° C. and one having no yield point were prepared, respectively. All of the other resin films were selected to have no yield point at 150° C. A case where there was no yield point was evaluated as "○ (a single circle)", and a case where there was a yield point was evaluated as x, and the results are shown in Table 1.

Cu: rolled copper foil (conductivity at 20° C.: 58.0×10$^6$ S/m; thickness: see Table 1);
Al: aluminum foil (conductivity at 20° C.: 39.6×10$^6$ S/m; thickness: see Table 1);
PI: polyimide film (relative dielectric constant at 20° C.: 3.5; no melting point; thickness: see Table 1);
PA: polyamide film (relative dielectric constant at 20° C.: 6.0; melting point: 300° C.; thickness: see Table 1);
PP: polypropylene film (relative dielectric constant at 20° C.: 2.4; melting point: 130° C.; thickness: see Table 1);
PC: polycarbonate film (relative dielectric constant at 20° C.: 3.0; melting point: 150° C.; thickness: see Table 1); and
PU: polyurethane film (relative dielectric constant at 20° C.: 6.5; melting point: 180° C.; thickness: see Table 1).

These metal foils and the resin films were stacked in the laminating order shown in Table1, and the thermocompression bonding was then carried out without using an adhesive, under a pressure of 4 MPa and at 330° C. for 0.5 h for examples in which PI was used; under a pressure of 6 MPa and at 300° C. for 0.5 hours for examples in which PA was used; under a pressure of 6 MPa and at 130° C. for 0.5 hours for examples in which PP was used; under a pressure of 6 MPa and 140° C. for 0.5 hours for examples in which PC was used; or under a pressure of 6 MPa and at 180° C. for 0.5 hours for examples in which PU was used, to obtain an electromagnetic shielding material in which the metal foils and the resin films were closely laminated.

It should be noted that the conductivity of the metal foil was measured by the double bridge method according to JIS C2525: 1999. It should also be noted that the relative dielectric constant was measured by the B method according to JIS C2151: 2006.

The presence or absence of the yield point of the resin film at 150° C. was evaluated using a tensile tester of model AGS-X manufactured by Shimadzu Corporation according to the test procedure as stated above. The stress (MPa) of the resin film at 150° C. and 4% tensile strain and the stress (MPa) of the metal foil at 150° C. and 4% tensile strain were measured using a tensile tester of model AGS-X manufactured by Shimadzu Corporation according to the method as described above. The results are shown in Table 1. It should be noted that in Table 1, the description order of materials in "Laminated Structure" and the description order of materials in "Thickness" and "Stress at 4% Tensile Strain" are the same.

(Magnetic Field Shielding Effect)

Each electromagnetic shielding material as stated above was set to a magnetic field shielding effect evaluation apparatus (Model TSES-KEC available from Techno Science Japan Co., Ltd.) and the magnetic field shielding effect at 200 kHz was evaluated at 25° C. according to the KEC method. The results are shown in Table 1. A case where the magnetic field shielding effect was 25 dB or more was evaluated as "⊚ (a double circle)", a case where it was 23 dB or more and less than 25 dB was evaluated as "○ (a single circle)", and a case where it was less than 23 dB as x. The results are shown in Table 1.

(Molding Test)

Each sheet-like electromagnetic shielding material having 90 mm×90 mm was subjected to a molding test in a mold for making a hemisphere having a diameter of 30 mm under conditions of a mold temperature of 150° C. and a pressure of 1 MPa by means of a pressure forming tester (a custom made article from Kitaguchi Seiki Co., Ltd.). In this case, a thickness reduction ratio was about 25%. A molded article was produced so that the outer peripheral surface side of the hemisphere was the rightmost material shown in the column of "Laminated Structure" in Table 1.

The presence or absence of breakage of each molded article after the molding test was confirmed. The presence or absence of breakage was confirmed by observing not only the outermost layer of the molded article, but also the inside thereof with X-ray CT (micro-CT scanner, TOSCANER 32251 μhd, available from TOSHIBA IT CONTROL SYSTEMS CORPORATION; a tube current of 120 μA; a tube voltage of 80 kV). The formability was evaluated as x when breakage of the metal foil or resin film was observed on the outer surface or inside of each molded article; the formability was evaluated as "○ (a single circle)" when no breakage was observed. Further, among the molded articles in which no breakage was observed, a molded article in which local thickness reduction was observed in two or more metal foils was evaluated as "○", and a molded article in which local thickness reduction was observed in any one of the metal foils was evaluated as "⊚ (a double circle)", and a molded article in which no local thickness reduction was observed in all the metal foils was evaluated as "⊚⊚ (two double circles)". The results are shown in Table 1.

TABLE 1

| | | | Stress at 4% Tensile Strain | | | | | | | | |
|---|---|---|---|---|---|---|---|---|---|---|---|
| | | | First Resin Layer $f_{R1}$ Mpa | First Metal Layer $f_{M1}$ Mpa | Second Resin Layer $f_{R2}$ Mpa | Second Metal Layer $f_{M2}$ Mpa | Third Resin Layer $f_{R3}$ Mpa | Third Metal Layer $f_{M3}$ Mpa | Fourth Resin Layer $f_{R4}$ Mpa | Fourth Metal Layer $f_{M4}$ Mpa | Fifth Resin Layer $f_{R5}$ Mpa |
| | Laminate Structure | Thickness (μm) | | | | | | | | | |
| Example 1 | PI/Cu/PI/Cu/PI | 50, 33, 75, 33, 50 | 60 | 100 | 60 | 100 | 60 | 0 | 0 | 0 | 0 |
| Example 2 | PI/Cu/PI/Cu/PI/Cu/PI | 50, 17, 75, 17, 75, 17, 50 | 60 | 100 | 60 | 100 | 60 | 100 | 60 | 0 | 0 |

TABLE 1-continued

| | | | | | | | | | | | |
|---|---|---|---|---|---|---|---|---|---|---|---|
| Example 3 | Cu/PI/Cu/ | 33, 100, 33 | 0 | 100 | 60 | 100 | 0 | 0 | 0 | 0 | 0 |
| Example 4 | Cu/PI/Cu/PI/Cu | 17, 75, 17, 76, 17 | 0 | 100 | 60 | 100 | 60 | 100 | 0 | 0 | 0 |
| Example 5 | PI/Cu/PI/Cu/PI | 100, 17, 50, 17, 26, 17 | 60 | 100 | 60 | 100 | 60 | 100 | 60 | 0 | 0 |
| Example 6 | PI/Cu/PI/Cu/PI | 50, 8, 13, 8, 50 | 60 | 100 | 60 | 100 | 60 | 0 | 0 | 0 | 0 |
| Example 7 | PI/Cu/PI/Cu/PI/Cu/PI/Cu/PI | 50, 12, 50, 12, 50, 12, 50, 12, 60 | 60 | 100 | 60 | 100 | 60 | 100 | 60 | 100 | 60 |
| Example 8 | PP/Cu/PP/Cu/PP/Cu/PP | 100, 17, 100, 17, 100, 17, 100 | 40 | 100 | 40 | 160 | 40 | 100 | 40 | 0 | 0 |
| Example 9 | PC/Cu/PC/Cu/PC | 50, 33, 100, 33, 50 | 90 | 100 | 90 | 100 | 90 | 0 | 0 | 0 | 0 |
| Example 10 | PU/Cu/PU/Cu/PU/Cu/PU | 100, 12, 100, 12, 100, 12, 100 | 30 | 100 | 30 | 100 | 30 | 100 | 30 | 100 | 0 |
| Example 11 | PA/Cu/PA/Cu/PA | 50, 33, 100, 33, 50 | 80 | 100 | 80 | 100 | 80 | 100 | 0 | 0 | 0 |
| Example 12 | PI/Al/PI/Al/PI/Al/PI | 50, 20, 75, 20, 75, 20, 50 | 60 | 50 | 60 | 50 | 60 | 50 | 60 | 0 | 0 |
| Example 13 | PC/Cu/PU/Cu/PC | 60, 33, 100, 33, 50 | 90 | 100 | 30 | 100 | 90 | 0 | 0 | 0 | 0 |
| Comparative Example 1 | PI/Cu/PI | 50, 12, 50 | 60 | 100 | 60 | 0 | 0 | 0 | 0 | 0 | 0 |
| Comparative Example 2 | PI/Cu/PI | 300, 300, 300 | 60 | 100 | 60 | 0 | 0 | 0 | 0 | 0 | 0 |
| Comparative Example 3 | Cu/PI/Cu | 17, 250, 17 | 0 | 100 | 60 | 100 | 0 | 0 | 0 | 0 | 0 |
| Comparative Example 4 | Al/PI/Al/PI/Al | 6, 9, 6, 9, 6 | 0 | 50 | 60 | 50 | 60 | 50 | 60 | 0 | 0 |
| Comparative Example 5 | PI/Cu/PI/Cu/PI | 50, 33, 75, 33, 60 | 60 | 100 | 66 | 100 | 60 | 0 | 0 | 0 | 0 |
| Comparative Example 6 | PI/Cu/PI/Cu/PI/Cu/PI | 50, 17, 75, 17, 75, 17, 50 | 60 | 100 | 60 | 100 | 60 | 100 | 60 | 0 | 0 |
| Comparative Example 7 | Cu/PI/Cu | 33, 75, 33 | 0 | 100 | 60 | 160 | 60 | 0 | 0 | 0 | 0 |
| Comparative Example 8 | Cu/PI/Cu/PI/Cu | 70, 75, 70, 75, 70 | 0 | 100 | 60 | 100 | 60 | 100 | 0 | 0 | 0 |
| Comparative Example 9 | PI/Cu/PI/Cu/PI/Cu/PI | 26, 70, 26, 33, 100, 17, 100 | 60 | 100 | 60 | 100 | 60 | 100 | 60 | 0 | 0 |

| | Total Metal Foil Thickness (μm) | Total Resin Foil Thickness (μm) | Total Thickness (μm) | Eq. (A) Minimum | Eq. (B) | Eq. (C) Minimum | Yield Point | Form-ability | Shielding Effect (dB) | Shielding Effect |
|---|---|---|---|---|---|---|---|---|---|---|
| Example 1 | 66 | 175 | 241 | 0.096 | 1.6 | 2.3 | ○ | ◎ | 24.1 | ○ |
| Example 2 | 51 | 260 | 301 | 0.049 | 2.9 | 4.4 | ○ | ◎◎ | 29.9 | ◎ |
| Example 3 | 66 | 100 | 166 | 0.191 | 0.9 | 1.8 | ○ | ○ | 26.4 | ◎ |
| Example 4 | 51 | 150 | 201 | 0.074 | 1.8 | 2.6 | ○ | ◎ | 29.9 | ◎ |
| Example 5 | 51 | 175 | 226 | 0.049 | 2.1 | 0.9 | ○ | ○ | 35.5 | ◎ |
| Example 6 | 16 | 113 | 129 | 0.006 | 4.2 | 4.7 | ○ | ◎ | 44.9 | ◎ |
| Example 7 | 48 | 250 | 298 | 0.035 | 3.1 | 5.0 | ○ | ◎ | 26.8 | ◎ |
| Example 8 | 51 | 400 | 451 | 0.099 | 3.1 | 4.7 | ○ | ◎ | 34 | ◎ |
| Example 9 | 66 | 200 | 266 | 0.098 | 2.7 | 4.1 | ○ | ◎◎ | 26.4 | ◎ |
| Example 10 | 36 | 400 | 436 | 0.070 | 3.3 | 5.0 | ○ | ◎ | 28.2 | ◎ |
| Example 11 | 66 | 200 | 266 | 0.096 | 2.4 | 3.6 | ○ | ◎◎ | 26.4 | ◎ |
| Example 12 | 60 | 250 | 310 | 0.059 | 5.0 | 7.5 | ○ | ○ | 28.2 | ◎ |
| Example 13 | 66 | 200 | 266 | 0.098 | 1.8 | 2.3 | ○ | ◎ | 26.4 | ◎ |
| Comparative Example 1 | 12 | 100 | 112 | 0.035 | 5.0 | 5.0 | ○ | ○ | 1.1 | X |
| Comparative Example 2 | 300 | 600 | 900 | 5.220 | 1.2 | 1.2 | ○ | ○ | 22.8 | X |
| Comparative Example 3 | 34 | 260 | 284 | 0.247 | 4.4 | 8.8 | X | X | 24.9 | ○ |
| Comparative Example 4 | 18 | 18 | 36 | 0.002 | 1.2 | 1.8 | ○ | ○ | 3.3 | X |
| Comparative Example 5 | 66 | 175 | 241 | 0.096 | 1.6 | 2.3 | ○ | X | 24.1 | ○ |
| Comparative Example 6 | 51 | 260 | 301 | 0.049 | 2.9 | 4.4 | ○ | X | 29.9 | ◎ |
| Comparative Example 7 | 66 | 75 | 141 | 0.144 | 0.7 | 1.4 | ○ | X | 24.1 | ○ |
| Comparative Example 8 | 210 | 150 | 360 | 0.305 | 0.4 | 0.6 | ○ | X | 61.4 | ◎ |
| Comparative Example 9 | 120 | 260 | 370 | 0.048 | 13 | 0.4 | ○ | X | 38.7 | ◎ |

Discussion

It is found that each of the electromagnetic shielding materials according to Examples 1 to 13 exhibits an excellent magnetic field shielding effect. On the other hand, each of these electromagnetic shielding materials had a smaller total thickness of the metal foils and achieved weight reduction, and also had good formability.

In contrast, each of Comparative Examples 1 and 2 had the insufficient shielding effect, because they used only one metal foil. In particular, Comparative Example 2 exhibited the lower shielding effect than Examples 1 to 13, despite the use of the metal foil having a larger thickness of 300 µm.

Comparative Example 3 resulted in breakage in the molding test, because it used the resin film having a yield point.

Comparative Example 4 could not provide sufficient shielding effect, because the equation (A) was not satisfied.

Comparative Examples 5 and 6 resulted in breakage in the molding test, because they used the resin film having a yield point.

Comparative Example 7 resulted in breakage in the molding test, because the equation (B) was not satisfied.

Comparative Example 8 resulted in breakage in the molding test, because the equations (B) and (C) were not satisfied.

Comparative Example 9 resulted in breakage in the molding test, because the equation (C) was not satisfied.

What is claimed is:

1. An electromagnetic shielding material comprising a structure in which at least two metal foils are closely laminated via at least one resin layer, wherein at least one resin forming the at least one resin layer has no yield point at 150° C.;

wherein all of combinations of the metal foils and the at least one resin layer forming the electromagnetic shielding material satisfy the following equation (A):

$$\sigma_M \times d_M \times d_R \geq 3 \times 10^{-3},$$  Equation (A):

in which:
$\sigma_M$ represents a conductivity of metal foil at 20° C. (S/m);
$d_M$ represents a thickness of metal foil (m); and
$d_R$ represents a thickness of resin layer (m);

wherein the electromagnetic shielding material satisfies the following equation (B):

$$\frac{\sum_{a=1}^{i}(d_{Ra}+f_{Ra})}{\sum_{b=1}^{j}(d_{Mb}+f_{Mb})} \geq 0.8$$  Equation (B)

in which:
i represents the number of the at least one resin layer forming the electromagnetic shielding material;
j represents the number of the metal foils forming the electromagnetic shielding material;
$d_{Ra}$ represents a thickness of the $a^{th}$ resin layer (µm);
$f_{Ra}$ represents a stress (MPa) of the $a^{th}$ resin layer at 150° C. and 4% tensile strain;
$d_{Mb}$ represents a thickness of the $b^{th}$ metal foil (µm); and
$f_{Mb}$ represents a stress (MPa) of the $b^{th}$ metal foil at 150° C. and 4% tensile strain; and wherein when the number of the metal foils forming the electromagnetic shielding material is defined as j, all the metal foils from the first foil to the $j^{th}$ foil satisfy the following equation (C):

$$\{(d_{Rb1} \times f_{Rb1})+(d_{Rb2} \times f_{Rb2})\}/(d_{Mb} \times f_{Mb}) \geq 0.8$$  Equation (C):

in which:
b represents an integer from 1 to j;
$d_{Rb1}$ represents a thickness (µm) of a resin layer adjacent to one surface of the $b^{th}$ metal foil;
$f_{Rb1}$ represents a stress (MPa) of the resin layer adjacent to one surface of the $b^{th}$ metal foil, at 150° C. and 4% tensile strain;
$d_{Rb2}$ represents a thickness (µm) of a resin layer adjacent to another surface of the $b^{th}$ metal foil;
$f_{Rb2}$ represents a stress (MPa) of the resin layer adjacent to another surface of the $b^{th}$ metal foil, at 150° C. and 4% tensile strain;
$d_{Mb}$ represents a thickness (µm) of the $b^{th}$ metal foil;
$f_{Mb}$ represents a stress (MPa) of the $b^{th}$ metal foil, at 150° C. and 4% tensile strain.

2. The electromagnetic shielding material according to claim 1, wherein each metal foil forming the electromagnetic shielding material has a conductivity of $1.0 \times 10^6$ S/m or more at 20° C.

3. The electromagnetic shielding material according to claim 1, wherein each metal foil forming the electromagnetic shielding material has a thickness of from 4 µm to 50 µm.

4. The electromagnetic shielding material according to claim 1, wherein each resin layer forming the electromagnetic shielding material has a relative dielectric constant of from 2.0 to 10.0 at 20° C.

5. The electromagnetic shielding material according to claim 1, wherein each resin layer forming the electromagnetic shielding material has a thickness of from 4 µm to 500 µm.

6. The electromagnetic shielding material according to claim 1, wherein the at least two metal foils and the at least one resin layer forming the electromagnetic shielding material are closely laminated by thermocompression bonding.

* * * * *

UNITED STATES PATENT AND TRADEMARK OFFICE
CERTIFICATE OF CORRECTION

Page 1 of 2

PATENT NO. : 11,019,759 B2
APPLICATION NO. : 16/089793
DATED : May 25, 2021
INVENTOR(S) : Tanaka It is certified that error appears in the above-identified patent and that said Letters Patent is hereby corrected as shown below:

On the Title Page

Item (57), Line 15, " Equation (B): $\dfrac{\sum_{a=1}^{i}(d_{Ra}+f_{Ra})}{\sum_{b=1}^{j}(d_{Mb}+f_{Mb})} \geq 0.8$ " should be " Equation (B): $\dfrac{\sum_{a=1}^{i}(d_{Ra} \times f_{Ra})}{\sum_{b=1}^{j}(d_{Mb} \times f_{Mb})} \geqq 0.8$ --.

In the Specification

At Column 3, Line 37, " Equation (B): $\dfrac{\sum_{a=1}^{i}(d_{Ra}+f_{Ra})}{\sum_{b=1}^{j}(d_{Mb}+f_{Mb})} \geq 0.8$ " should be " Equation (B): $\dfrac{\sum_{a=1}^{i}(d_{Ra} \times f_{Ra})}{\sum_{b=1}^{j}(d_{Mb} \times f_{Mb})} \geqq 0.8$ --.

At Column 11, Line 42, " Equation (B): $\dfrac{\sum_{a=1}^{i}(d_{Ra}+f_{Ra})}{\sum_{b=1}^{j}(d_{Mb}+f_{Mb})} \geq 0.8$ " should be Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 11,019,759 B2

$$\text{Equation (B)}: \frac{\sum_{a=1}^{i}(d_{Ra} \times f_{Ra})}{\sum_{b=1}^{j}(d_{Mb} \times f_{Mb})} \geq 0.8$$

-- --.

In the Claims

At Column 17, Line 36, " $\text{Equation (B)}: \dfrac{\sum_{a=1}^{i}(d_{Ra}+f_{Ra})}{\sum_{b=1}^{j}(d_{Mb}+f_{Mb})} \geq 0.8$ " should be $$\text{Equation (B)}: \frac{\sum_{a=1}^{i}(d_{Ra} \times f_{Ra})}{\sum_{b=1}^{j}(d_{Mb} \times f_{Mb})} \geq 0.8$$

-- --.